United States Patent [19]

Kataoka et al.

[11] Patent Number: 5,653,810
[45] Date of Patent: Aug. 5, 1997

[54] APPARATUS FOR FORMING METAL FILM AND PROCESS FOR FORMING METAL FILM

[75] Inventors: Yuzo Kataoka; Yukihiro Hayakawa, both of Atsugi, Japan

[73] Assignee: Canon Kabushiki Kaisha, Tokyo, Japan

[21] Appl. No.: 407,050

[22] Filed: Mar. 17, 1995

Related U.S. Application Data

[63] Continuation of Ser. No. 967,239, Oct. 27, 1992, abandoned.

[30] Foreign Application Priority Data

Oct. 29, 1991 [JP] Japan ................................ 3-282970
Oct. 7, 1992 [JP] Japan ................................ 4-268520

[51] Int. Cl.$^6$ ................................................ C23C 16/00
[52] U.S. Cl. ........................................ 118/723 E; 118/724
[58] Field of Search ........................... 156/345; 118/723 E, 118/723 IR, 724; 204/298.39, 298.09, 298.06

[56] References Cited

U.S. PATENT DOCUMENTS

| | | | |
|---|---|---|---|
| 4,610,748 | 9/1986 | Engle et al. | 156/345 |
| 4,633,811 | 1/1987 | Maruyama | 118/723 E |
| 4,745,088 | 5/1988 | Inoue et al. | 118/724 X |
| 5,040,046 | 8/1991 | Chhabra et al. | 427/39 X |
| 5,160,545 | 11/1992 | Maloney et al. | 118/724 X |

FOREIGN PATENT DOCUMENTS

| | | | |
|---|---|---|---|
| A0143479 | 6/1985 | European Pat. Off. | C23C 16/50 |
| 0420595 | 4/1991 | European Pat. Off. | |
| A0420595 | 4/1991 | European Pat. Off. | H01L 21/285 |
| A58-43508 | 3/1983 | Japan . | |

OTHER PUBLICATIONS

Rosler, R.S., et al. "Plasma Enhanced CVD In a Novel LPCVD–type System", Solid State Technology, vol. 24, Apr. 1981, pp. 172–177.

Tsubouchi, K, et al. "Selective and Nonselective Deposition of Aluminum By LPCVD Using DMAH And Microregion Observation of Single Crystal Aluminum With Scanning µ–Rheed Microscope", Symposium on VLSI Technology, Honolulu, Jun. 4–7, 1990, No. Symp. 10, Institute of Electrical and Electronics Engineers, pp. 5–6.

Patent Abstracts of Japan vol. 007, No. 123 (E–178), May 27, 1983.

Rosler et al., "LPCVD–Type Plasma Enhanced Deposition System", Solid State Technology, Dec. 1979, pp. 88–92.

Primary Examiner—John Niebling
Assistant Examiner—Joni Y. Chang
Attorney, Agent, or Firm—Fitzpatrick, Cella, Harper & Scinto

[57] ABSTRACT

An apparatus for forming metal film for forming metal films on substrates comprises a reaction chamber, a plurality of first and second electrodes alternately arranged in the reaction chamber, an energy supply means that supplies to the first and second electrodes an electrical energy for generating plasma, a heating means for heating a plurality of substrates disposed between the first and second electrodes, and a gas feed means that feeds into the reaction chamber a starting material gas for forming metal films; the plasma is generated across the first and second electrodes to form metal films on the plurality of substrates.

The apparatus can form metal films at a high throughput at one time process, and at a low cost.

13 Claims, 4 Drawing Sheets

APPARATUS FOR FORMING METAL FILM AND PROCESS FOR FORMING METAL FILM

This application is a continuation of application Ser. No. 07/967,239 filed Oct. 27, 1992 abandoned.

BACKGROUND OF THE INVENTION

1. Field of the Invention

The present invention relates to an apparatus for forming metal film and a process for forming metal films. More particularly, it relates to an apparatus for forming metal films, and a process for forming metal film, that can form a metal films at a high throughput.

2. Related Background Art

In electronic devices or integrated circuits making use of semiconductors, aluminum (Al), Al—Si or the like have been hitherto used in electrodes or wiring. In such use, Al is inexpensive, has a high electrical conductivity and a dense oxide film can be formed on its surface. Hence it has many advantages such that it is chemically protected and therefore stable and it can achieve good adhesion to Si.

With an increase in the degree of integration of integrated circuits such as LSIs, it has become particularly necessary in recent years to make wiring finer or form wiring in multilayers. Hence, a new severe demand is directed to conventional Al wiring. As the size is made finer with an increase in the degree of integration, the surfaces of LSIs or the like tend to be formed in intense irregularity after going through the steps of oxidation, diffusion, thin-film deposition, etching and so forth. Electrodes or wiring metals, however, must be deposited on stepped surfaces without disconnecting or must be deposited in via holes that are minute in diameter and depth. In the case of 4 Mbit or 16 Mbit DRAMs (dynamic RAM), the aspect ratio (via hole depth/via hole diameter) of via holes in which metals such as Al must be deposited is 1.0 or more and the via hole diameter itself is 1 μm or less. It is accordingly required to provide a technique that enables good deposition of Al even in the via holes having a large aspect ratio.

Al must be deposited not only to fill up the via holes but also to form wiring on insulating films and the resulting deposited films must be a good quality.

For the formation of such deposited films, conventional sputtering can not meet the demands stated above.

In conventional sputtering, films are formed in an extremely small thickness at relatively stepped portions or sidewalls of insulating film to cause disconnection in an extreme case, resulting in greatly lower reliability of LSIs. As for bias sputtering, the process has technical problems which are difficult to solve, e.g., damage by charged particles or a limit in deposition rate.

Some techniques are proposed which intend to solve such technical problems.

One of them is in a U.S.A. patent application filed on Sep. 24, 1990 under Ser. No. 587,045, entitled "Process for Forming Deposited Film", and is disclosed in European Patent Publication No. 420,595. This process comprises Selectively depositing Al in a via hole, the bottom of which is formed of an electron donative surface, thereafter generating plasma in the vicinity of the surface of a substrate to modify the electron non-donative surface formed of, e.g., $SiO_2$ or $Si_3N_4$, and depositing Al on the modified surface.

Here, the modification is meant to bring the surface into the state that free electrons are seemingly present even if the surface is electron non-donative, and can participate in the surface reaction. According to plasma surface modification treatment, it is possible to cut off Si—O bonds to generate electrons on account of incomplete bonds.

Such electrons accelerate chemical reaction as a result of electron transfer between the substrate and starting material gas molecules adsorbed on the substrate surface.

FIG. 1 illustrates an apparatus for such conventional metal film formation. Reference numeral 1 denotes a semiconductor wafer on which the metal film is to be formed, and which is placed on a substrate holder 3 provided with a heating means 4.

To a reaction chamber 2, an exhaust system is provided via a gate valve 7 and a slow-leak valve 8 so that the inside of the reaction chamber can be evacuated. Above the reaction chamber 2, a bubbler 6 and a mixing device 5 are provided as a starting material gas feeding means that feeds starting material gas into the reaction chamber. Reference numeral 10 denotes a transport chamber through which the wafer 1 is carried in or taken out of the reaction chamber 2, which is provided via a valve 13. The inside of the chamber 10 is connected to an exhaust system 12 via a valve 11 so that the inside of the chamber 12 can be independently evacuated.

Reference numeral 16 denotes an electrode that generates plasma; and 14, a power source that supplies an electrical energy for generating the plasma, which is grounded at its terminal end.

In the process for forming metal film making use of the apparatus for forming metal film described above, electrons must be supplied uniformly over the whole deposition surface of the substrate, and hence this is a method of processing one sheet of substrate (wafer) in a one time deposition process. Thus, it has been difficult to obtain a throughput high enough to achieve mass production.

Now, the present inventors have tried a method of forming metal films using the FIG. 1 apparatus whose reaction chamber has been enlarged so that a plurality of substrates can be held.

However, compared with the FIG. 1 apparatus, a poor uniformity tended to result with regard to the metal films on different wafers and the metal film on the same wafer which were formed by non-selective deposition utilizing plasma, and it was difficult to always obtain uniform metal films.

SUMMARY OF THE INVENTION

An object of the present invention is to provide an apparatus for forming metal film and a process for forming film that can form metal films in a high throughput and yet can obtain metal films in an with excellent uniformity.

Another object of the present invention is to provide an apparatus for forming deposited film and a process for forming deposited film that can make excellent control of plasma and can readily carry out changeover between selective deposition and non-selective deposition.

The above objects can be achieved by an apparatus for forming metal film for forming metal films on substrates, comprising;

- a reaction chamber;
- a plurality of first and second electrodes alternately arranged in said reaction chamber;
- an energy supply means that supplies to said first and second electrodes an electrical energy for generating plasma;
- a heating means for heating a plurality of substrates disposed between said first and second electrodes;

and a gas feed means that feeds into said reaction chamber a starting material gas for forming metal films;

said plasma being generated across said first and second electrodes to form metal films on said plurality of substrates.

The above objects can be also achieved by a process for forming metal film comprising the steps of;

providing a plurality of substrates having an electron donative surface and an electron non-donative surface between a plurality of first and second electrodes altenately arranged in a reaction chamber;

feeding into said reaction chamber a starting material gas for forming metal films;

selectively forming a metal film on said electron donative surface; and forming thereafter a metal film on said electron non-donative surface, utilizing plasma generated across said first and second electrodes.

According to the present invention, a uniform plasma can be generated corresponding with all the deposition surfaces of a plurality of substrates, and hence uniform surface modification and/or uniform supply of free electrons can be carried out, so that metal films can be formed selectively.

According to the present invention, different from the conventional sheet-by-sheet treating apparatus for forming metal film, a plurality of substrates can be simultaneously treated in a film deposition process, and hence good and uniform metal films can be continuously formed over the entire surfaces of the substrates.

DESCRIPTION OF THE PREFERRED EMBODIMENTS

The apparatus for forming metal film of the present invention comprises a reaction chamber provided in its inside with a plurality of pairs of electrodes alternately arranged and a plurality of substrates disposed between the electrodes. An electrical energy is applied across the pairs of electrodes to generate plasma across the electrodes.

The reaction chamber may be made of quartz or a metal. In the case when the selective deposition as described later is carried out, it is preferred to employ a reaction tube made of quartz.

The electrodes may be formed of a conventional conductive metallic material, and may be so constructed as to also serve as substrate holders that hold the substrates.

As an energy supply means for supplying the electrical energy, a conventional high-frequency power source can be preferably used.

As a means for heating the substrates, a heating element provided inside the reaction chamber or a heating coil or lamp provided outside the reaction chamber may be used.

Different from the conventional constitution, it is preferable to use a reaction tube made of quartz which is a transparent insulator, to provide the heating means outside the reaction tube, and to provide electrodes for generating plasma inside the reaction tube. Such a combination is desirable.

A gas feed means, which is a means for feeding in the reaction chamber the desired gas alone or a mixture thereof with other gas, may comprise a high-pressure gas bomb, a gas feed pipe, a mass flow controller, a valve, a mixer, a purifier, a filter, a bubbler and so forth, which may be used in appropriate combination according to the gas used.

A gas exhaust means may be so constructed that a mechanical booster pump, a turbo molecular drag pump, an oil diffusion pump and so forth are connected to the inside of the reaction chamber via a valve or a filter.

Specific embodiments of the present invention will be described below. The present invention is by no means limited to these embodiments, and may embrace those which can achieve the objects of the present invention.

EXAMPLE 1

Figure 1:
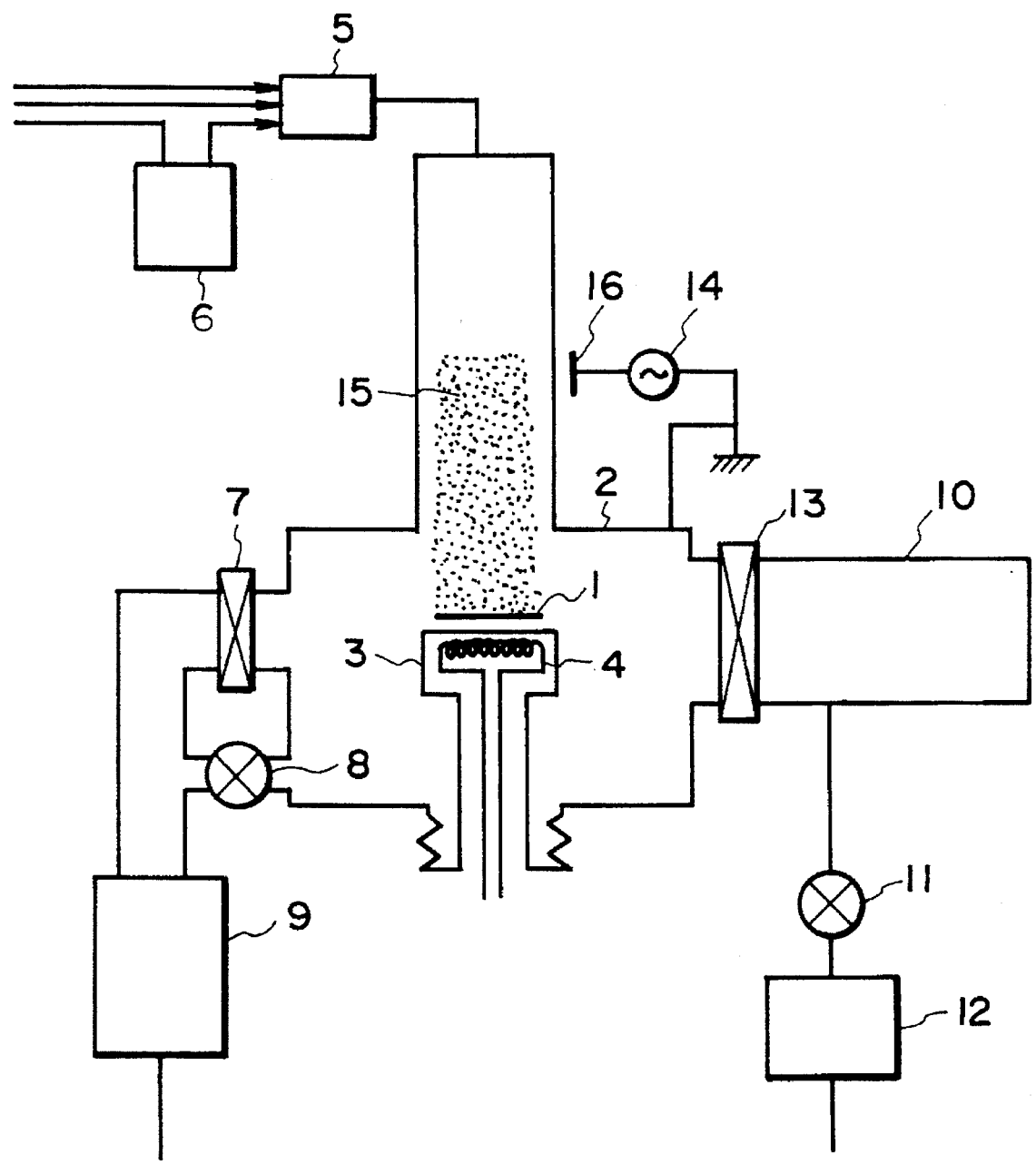
FIG. 1 is a diagrammatic illustration of a conventional apparatus for forming metal film.
Figure 2:
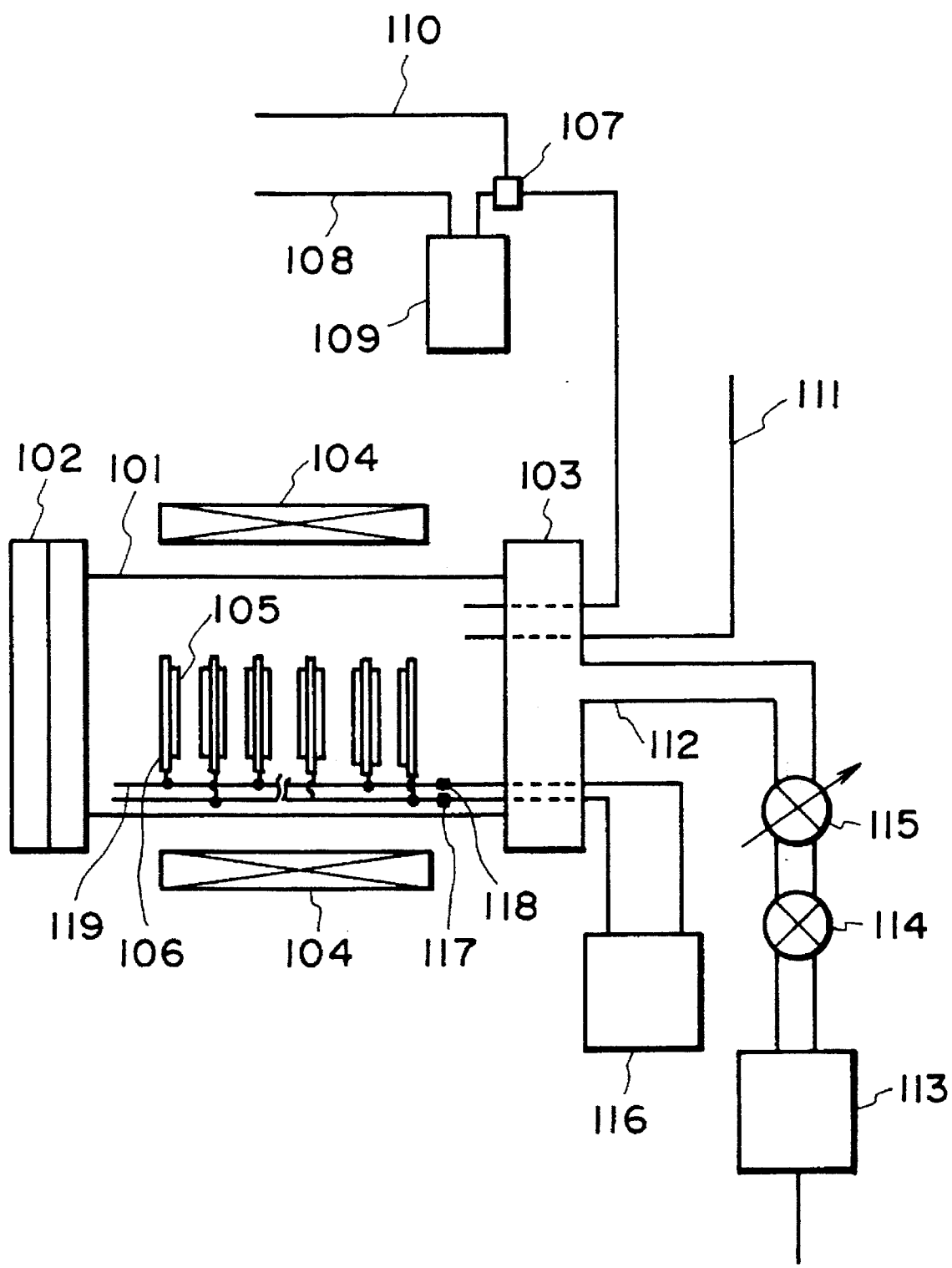
FIG. 2 is a diagrammatic illustration of an embodiment of the apparatus for forming metal film according to the present invention.

FIG. 2 is a diagrammatic illustration of an apparatus for forming metal film to which the present invention has been applied.

Reference numeral 101 denotes a reaction tube made of quartz, which is substantially kept close from the surroundings and forms a space in which the metal films are formed. In the present example, quartz is used as a material for the reaction tube 101, which may alternatively be made of a metal. In the latter case, the reaction tube 101 should be cooled. Reference numeral 102 denotes a metal flange for opening or shutting the reaction tube 101; and 103, a metal flange for introducing starting material gas and reaction gas into the reaction tube 101 or inserting the substrates.

Reference numeral 104 denotes a heater that surrounds the periphery of the reaction tube 101. The temperature of substrates 105 can be controlled by controlling the heating temperature of this heater 104. Here, the substrates 105 are fitted to substrate holders (conductive electrodes) 106.

A gas feed system is constructed in the following way.

Reference numeral 107 denotes a gas mixer, in which reaction gas and carrier gas are adjusted to the desired flow rates and mixed and from which the mixed gas is fed into the reaction tube 101. In instances in which a material kept liquid at room temperature is used as the reaction gas, the gas is introduced into a material vaporizer 109 through a gas feed line 108, and the material as the reaction gas is vaporized there. The carrier gas is sent to a gas mixer 107 through a carrier gas feed line 110. Reference numeral 111 denotes a gas line through which an inert gas such as $N_2$ is fed into the reaction tube 101 when the inside of the reaction tube 101 having been evacuated is restored to have atmospheric pressure.

A gas exhaust system is constructed in the following way. The gasses inside the reaction tube 101 are exhausted by means of an exhaust unit 113 connected through a gas exhaust pipe 112. The exhaust unit 113 is comprised of an exhaust pump such as a turbo molecular drag pump. Reference numeral 114 denotes an exhaust main valve, which is opened when the inside of the reaction tube 101 is evacuated. Reference numeral 115 denotes a control valve, which controls the pressure inside the reaction tube 101 to be an appropriate pressure in the course of metal deposition.

A power source as an electrical energy supply means for generating plasma is comprised of a high-frequency power source unit 116. The high-frequency power source line is led to a high-frequency power source terminal 117 and at the same time connected to another high-frequency power source terminal 118 provided on the side of the substrates fitted to the electrodes. Thus the electrical energy is supplied to the substrate holder through a conductive rail 119.

Figure 3:
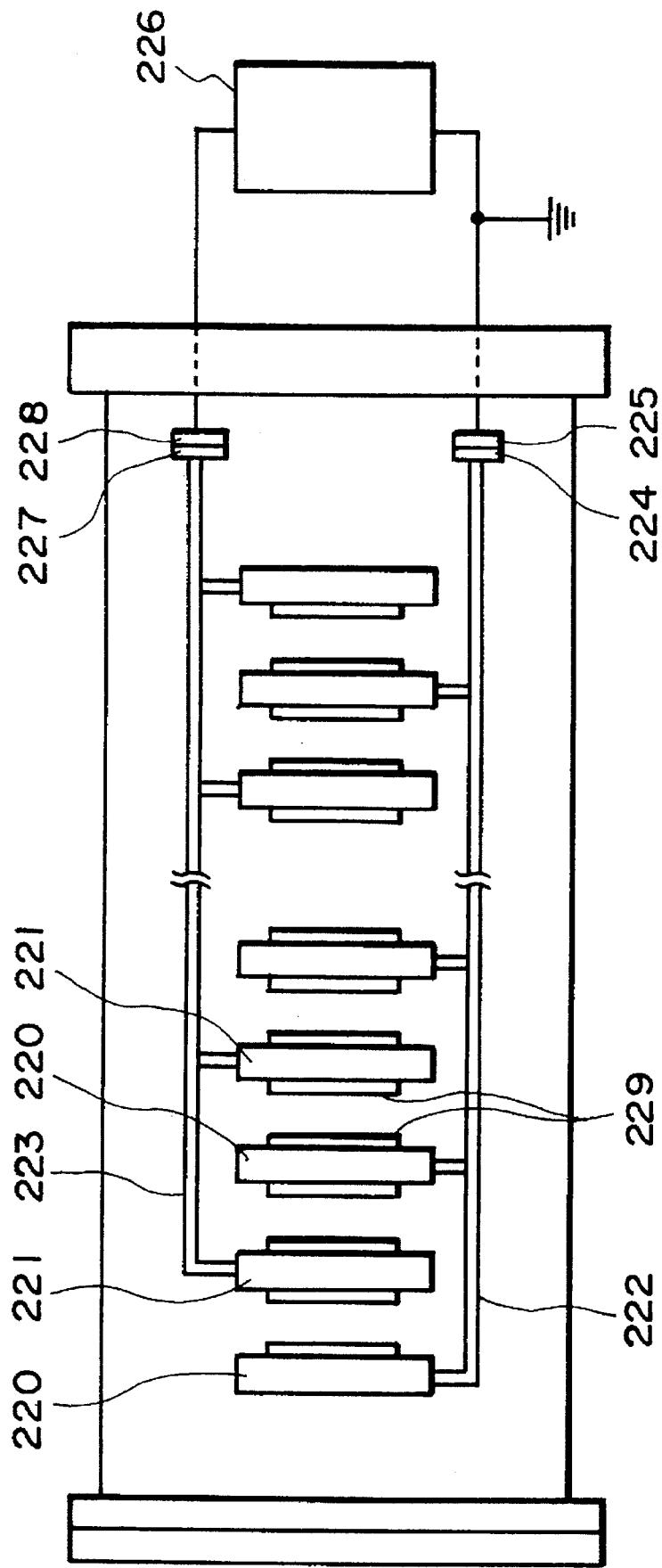
FIG. 3 is a diagrammatic illustration of the disposition of electrodes in the apparatus for forming metal film according to the present invention.

FIG. 3 is a diagrammatic illustration to detail the electrode portion in FIG. 2.

A plurality of first electrodes 220 and second electrodes 221 are vertically and alternately arranged. In the embodiment shown in FIG. 3, the electrodes should be vertically or non-horizontally arranged. They may alternatively be horizontally arranged. The first electrodes 220 and second electrodes 221 are connected to conductive rails 222 and 223, respectively. The first electrodes 220 connected to the conductive rail 222 are connected to a high-frequency power source unit 226 through a terminal 224 provided at an end of the conductive rail 222, via a terminal 225 on the side of the high-frequency power source. Similarly, the second electrodes 221 are connected to the high-frequency power source unit 226 through a terminal 227 provided at an end of the conductive rail 223, via a terminal 225 on the side of the high-frequency power source. Reference numeral 229 denotes semiconductor substrates provided between the first electrodes 220 and second electrodes 221.

Here, a high-frequency voltage is applied across the conductive rails 223 and 222, whereby a uniform plasma can be generated across the respective electrodes 221 and 220 serving also as substrate holders.

The application of the high-frequency voltage is controlled by a control circuit provided in the unit 226 to take timing of voltage application and set the time for which the voltage is applied.

EXAMPLE 2

Figure 4:
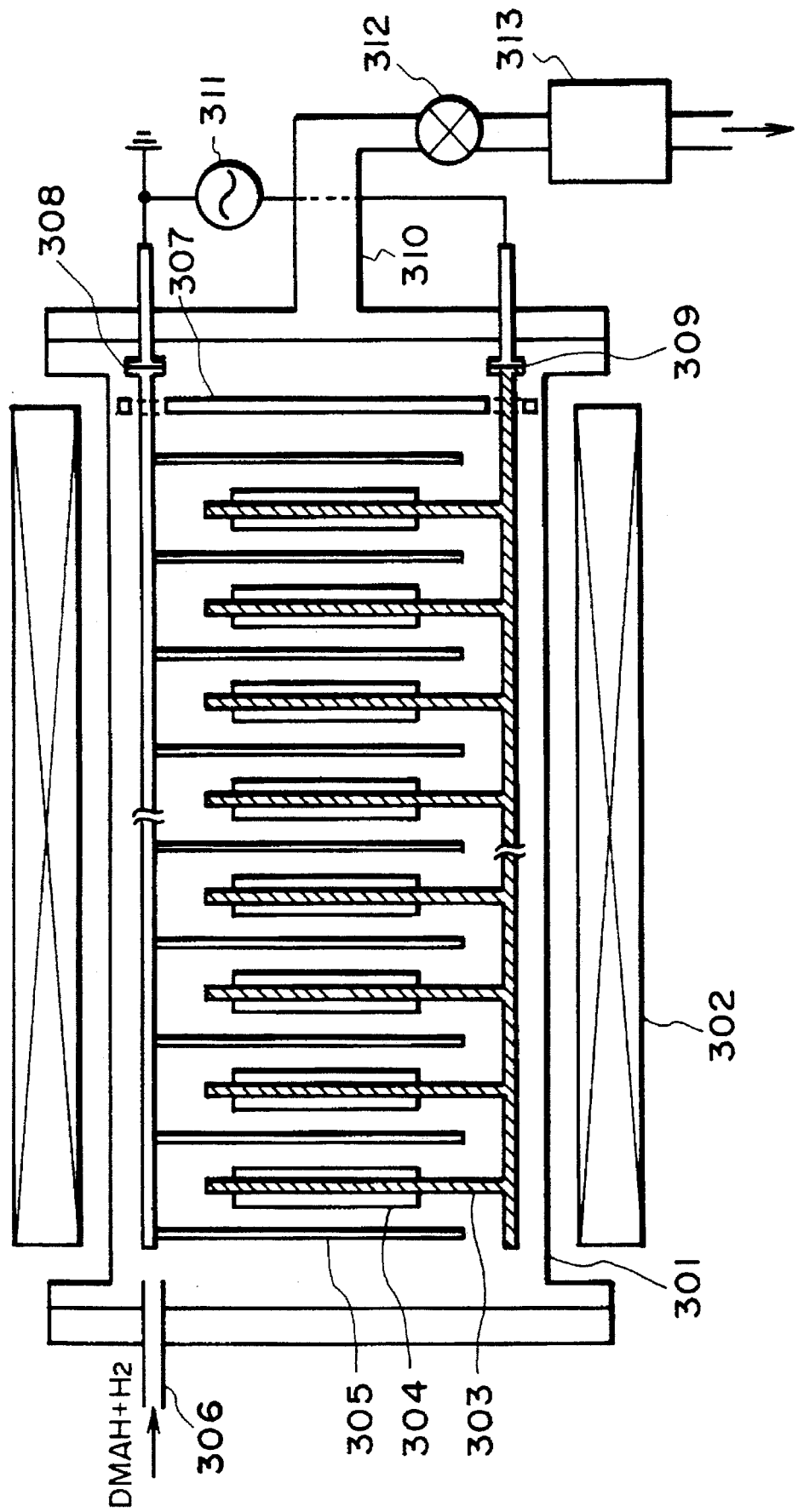
FIG. 4 is a diagrammatic illustration of another embodiment of the apparatus for forming metal film according to the present invention.

FIG. 4 is a diagrammatic illustration of another embodiment of the apparatus for forming metal film according to the present invention. In the drawing, reference numeral 301 denotes a reaction tube made of quartz, which is substantially kept close from the surroundings and forms a space in which the metal films are formed; 302, a heater for controlling the substrate temperature; 303, electrodes serving also as semiconductor substrate holders; 304, semiconductor substrates (wafers); 305, opposing electrodes with which the electrodes 303 form pairs; 306, a gas inlet for starting material gas; 305, a deposit shield plate; 308, a contact connected with an external power source for the wafer-opposing electrodes; 309, a contact connected with an external power source for the wafer-side electrodes; 310, an exhaust pipe; 311, high-frequency power source unit; 312, a pressure control valve for regulating the pressure in the reaction tube; and 313, an exhaust unit comprised of a turbo molecular drag pump or the like.

The substrate-side electrodes 303 serve as wafer boats on both sides of which the wafers are provided, and are connected to the external high-frequency power source unit via the contact 309. The wafer-opposing electrodes 305 are so structured as to have no contact connected with the wafer-side electrodes at all, and in themselves are connected to the external high-frequency power source unit via the contact 308.

After the wafer boats having such a structure have been received in the reaction tube 301, the exhaust unit 313 and the pressure control valve 312 are operated to control the pressure inside the reaction tube to be at any desired level suited for the metal film formation.

The temperature inside the reaction tube is controlled by the heater 302.

Now, after the temperature and pressure have reached predetermined levels, a starting material gas is fed at an appropriate mixing ratio into the reaction tube from the gas inlet 306. Then the high-frequency power source unit 311 is operated to generate plasma across the electrodes 303 and the opposing electrodes 305. Thus, it becomes possible to carry out deposition for the metal film formation.

At this stage, the electrodes 303 and the opposing electrodes 305 are completely brought into non-contact with each other interposing the deposit shield plate 307, so that any short between the electrodes 303 and the opposing electrodes 305 can not occur during the application of high-frequency power.

The apparatus for forming metal film of the present invention as described is used in a process for forming metal film as described below.

The process is a CVD (chemical vapor deposition) process carried out using as a starting material gas a compound containing at least one of metal atoms such as Al, W, Ti, Mo, Cu and Ta.

The starting material gas specifically includes trimethylaluminum (TMA), triisobutylaluminum (TiBA), dimethylaluminum hydride (DMAH), monomethylaluminum hydride (MMAH), diethylaluminum hydride (DEAH), triethylaluminum (TEA), trichloroaluminum (TClA), tungsten hexafluoride ($WF_6$), trimethyltungsten ($W(CH_3)_3$), triethyltungsten ($W(C_2H_6)_3$), bisacetylacetonatocopper ($Cu(C_5H_7O_2)_2$), bisdipivaloylmetanitocopper ($Cu(C_{11}H_{19}O_2)_2$), bishexafluoroacetylacetonatocopper ($Cu(C_5HF_6O_2)_2$), tetrachlorotitanium ($TiCl_4$), tetrabromotitanium ($TiBr_4$), tetramethyltitanium ($Ti(CH_3)_4$), and molybdenum carbonyl ($Mo(CO)_6$).

The above CVD may be selective CVD that effects selective deposition only on a certain region, or may be non-selective CVD that effects deposition on the whole surface of a wafer. The apparatus described above can best exhibit its performance when the selective CVD is carried out without using plasma and thereafter the non-selective CVD is carried out utilizing plasma. In this case, the process may be carried out in such a way that the plasma is generated only when the wafer surfaces are plasma-treated before the non-selective CVD is carried out, and no plasma is generated thereafter, or in such a way that the plasma is maintained in the course of the non-selective CVD. In the case when both the selective CVD and the non-selective CVD are carried out, the whole surfaces in the reaction chamber except the electrode portions opposing the wafers should be comprised of insulating materials. To get better understanding of this mechanism, changeover between selective deposition and non-selective deposition will be explained.

Process for Forming Film

A process of forming metal films mainly composed of Al (including pure Al) that are preferred in the present invention (an Al-CVD process) will be described below.

This process is a process suited for burying a metal material in fine and deep openings (contact holes or throughholes) having, for example, an aspect ratio of 1 or more, and is a deposition process with an excellent selectivity.

Metal films formed by this process can have a very good crystallinity so that a monocrystalline Al can be formed, and contain little carbon or the like.

Similarly, the metal films thus formed have a resistivity as low as 0.7 to 3.4 $\mu\Omega\cdot cm$, have a reflectance as high as 85 to 95% and have excellent surface properties such that a 1 μm or higher hillock density is about 1 to 100 cm$^{-2}$.

As to the probability of occurrence of alloy spikes at the interface between the metal film and silicon, it can be equal to substantially zero when a failure probability of a 0.15 μm semiconductor junction is taken.

This process is a process in which a deposited film is formed on an electron-donative substrate by the use of an alkylaluminum halide gas and hydrogen gas. In particular, using a methyl group-containing alkylaluminum hydride such as monomethylaluminum hydride (MMAH) or dimethylaluminum hydride (DMAH) as the starting material gas and $H_2$ as the reaction gas, the substrate surface may be heated in the presence of a mixed gas of these, so that an Al film with a good quality can be deposited.

Here, in the case of selective deposition of Al, the surface temperature of the substrate may preferably be maintained at a temperature not lower than the decomposition temperature of the alkylaluminum hydride and lower than 450° C., more preferably from 260° C. to 440° C., and most suitably from 260° C. to 350° C.

A method by which the substrate is heated so as to have the temperature within the above range may include direct heating and indirect heating. Al films with a good quality can be formed at a high deposition rate particularly when the substrate is maintained at the above temperature by direct heating. For example, when the temperature of the substrate surface in the formation of Al films is set within the preferable temperature range of 260° C. to 440° C., films with a good quality can be obtained at a deposition rate as high as 3000 Å to 5000 Å/min which is higher than the case of resistance heating. Such direct heating (the energy from a heating means is directly transmitted to the substrate to heat the substrate itself) may specifically include lamp heating using a halogen lamp or a xenon lamp. The indirect heating may include the resistance heating, which can be carried out using a heater element provided in a substrate holding member disposed in the deposited film formation space to hold the substrate on which the deposited film is to be formed.

According to this method, the CVD process may be applied to the substrate on which an electron donative surface portion and an electron non-donative surface portion are present together, so that a monocrystal of Al is formed selectively only on the electron donative surface portion.

An electron donative material and an electron non-donative material are used here. The electron donative material is meant to be a material where free electrons are present in the substrate or free electrons are intentionally produced therein, and having a surface capable of accelerating chemical reaction on account of electron transfer between the substrate and starting material gas molecules adsorbed on the substrate surface. For example, metals and semiconductors are commonly considered electron donative material. A metal or semiconductor on the surface of which a thin oxide film is present can also cause the chemical reaction on account of the electron transfer between the substrate and starting material gas molecules adsorbed thereon, and hence is also included in the electron donative material of the present invention.

The electron donative material may specifically include p-type, i-type and n-type conductivity semiconductors as exemplified by Group III-V element compound semiconductors of a double, triple or more, multiple system comprised of a combination of a Group III element such as Ga, In or Al and a Group V element such as P, As or N, or semiconductor materials such as monocrystalline silicon and amorphous silicon; and the following metals, alloys or silicides, as exemplified by tungsten, molybdenum, tantalum, copper, titanium, aluminum, titanium aluminum, titanium nitride, aluminum silicon copper, aluminum palladium, tungsten silicide, titanium silicide, aluminum silicide, molybdenum silicide and tantalum silicide.

On the other hand, a material that forms the surface on which Al or Al—Si is not selectively deposited, i.e., the electron non-donative material may include silicon oxide formed by thermal oxidation, CVD or the like and glasses such as BSG, PSG and BPSG, or oxide films, thermal nitride films, and silicon nitride films formed by plasma CVD, reduced pressure CVD, ECR-CVD or the like.

According to this Al-CVD process described above, a metal film mainly composed of Al as described below can also be selectively deposited, and shows excellent properties in its film quality.

For example, in addition to the alkylaluminum hydride gas and hydrogen, a gas containing Si atoms such as $SiH_4$, $Si_2H_6$, $Si_3H_8$, $Si(CH_3)_4$, $SiCl_4$, $SiH_2Cl_2$ or $SiHCl_3$, a gas containing Ti atoms such as $TiCl_4$, $TiBr_4$ or $Ti(CH_3)_4$ and/or a gas containing Cu atoms such as bisacetylacetonatocopper $(Cu(C_5H_7O_2)_2)$ bisdipivaloylmetanitocopper $Cu(C_{11}H_{19}O_2)_2$ or bishexafluoroacetylacetonatocopper $Cu(C_5HF_6O_2)_2$ may be fed into the reaction chamber in an appropriate combination to give a mixed gas atmosphere, and a conductive material as exemplified by Al—Si, Al—Ti, Al—Cu, Al—Si—Ti or Al—Si—Cu may be selectively deposited to form the electrode.

The Al-CVD process described above is a film forming process that can achieve an excellent selectivity and can give a deposited film with good surface properties. Hence, when a non-selective film forming process is applied in the subsequent deposition step to also form an Al film or a metal film mainly composed of Al, on the aforesaid Al film formed by selective deposition and $SiO_2$ or the like serving as an insulating film, it is possible to obtain a metal film having high general-purpose properties as films for semiconductor device wiring.

Such a metal film can be specified as follows: A combination of selectively deposited Al, Al—Si, Al—Ti, Al—Cu, Al—Si—Ti or Al—Si—Cu with non-selectively deposited Al, Al—Si, Al—Ti, Al—Cu, Al—Si—Ti or Al—Si—Cu.

It is also possible to utilize the Al-CVD process to form the metal film on an insulating film. For that purpose, the insulating film may be subjected to the step of surface modification to form a substantially electron donative surface portion. Such surface modification can be carried out by plasma CVD or a method in which damage caused by plasma is imparted to the insulating film.

Formation of Al films by the use of the metal film forming apparatus of the embodiments described above will be described below.

Dimethylaluminum hydride (DMAH) is used as the starting material gas, and $H_2$ as the carrier gas. The deposition of Al should be carried out at a degree of vacuum of 1.2 to 3 Torr and a DMAH partial pressure of $1.1 \times 10^{-3}$ to $12.6 \times 10$ Torr, and should be carried out at a deposition temperature of 250° to 290° C. Under such deposition conditions, the deposition rate comes to be about 800 Å/min when Al is selectively deposited by organic metal CVD in via holes whose bottoms are comprised of the electron donative material.

The deposition time comes to be 7 minutes and 30 seconds when, for example, Al is selectively deposited by organic metal CVD in contact holes of 6,000 Å. When the deposition of Al is carried out by this organic metal CVD, no high-frequency plasma is generated.

Thereafter, the high-frequency power source unit is electrified to generate a high-frequency voltage, so that the plasma is generated across the electrodes and thus the surfaces formed of, for example, SiO$_2$ electron non-donative material which constitutes the substrates fitted onto the electrodes can be modified to give the surfaces formed of the electron donative material.

With regard to the plasma irradiation time, degree of vacuum, partial pressure of DMAH and deposition temperature at this stage, the treatment is carried out under the same conditions as the conditions for the deposition of Al described above. The irradiation with plasma should be carried out for about 1 minute. Plasma electron density should be 5×10$^8$ to 3×10$^9$ cm$^{-3}$ right above the substrate. The plasma power should be 0.1 to 1 W/cm$^3$.

The surface modification of SiO$_2$ by this irradiation with plasma enables formation of dense and uniform Al nuclei, and hence uniform Al films can be formed over the whole surfaces of the substrates. At this stage, Al films are formed at a deposition rate of about 800 Å/min.

The Al films formed under such conditions have a resistivity of as low as 3 μΩ·cm, and are a good quality.

According to the present embodiments, different from the conventional sheet-by-sheet system, Al films can be formed on a plurality of substrates at one time without decreasing the Al film deposition rate.

Thereafter, in order to fabricate electronic devices or integrated circuits, the Al films are subjected to patterning to form metal wiring and/or electrodes.

Experiment 1

Characteristics of the Al film forming process according to the prior art and the Al film forming process according to the first embodiment described above were compared to obtain the results as shown in Table 1. In Table 1, the in-plane distribution indicates scattering of Al layer thickness per one sheet of wafer, and d represents standard deviation of the scattering of layer thickness. The within-batch distribution indicates scattering of layer thickness measured at several points on the wafer. The throughput indicates treatment results obtained when Al was buried in via holes of 6,000 Å and wiring of 6,000 Å in width was formed.

The plasma may be maintained not only in the course of the surface modification but also in the course of the non-selective deposition. In the latter case, it follows that the non-selective deposition is carried out by plasma CVD.

TABLE 1

|  | Prior art | Example 1 |
| --- | --- | --- |
| Number of treated sheets: | 1 sheet | 150 sheets |
| Deposition rate: | 800 Å/min. at maximum | 800–1,000 Å/min. |
| In-plane distribution (3σ): | 18% | 7% |
| Within-batch distribution (3σ): | — | 4% |
| Changeover*: | Good | Good |
| Throughput: | 26 min/sheet | 46 min/150 sheets (about 0.3 min/sh) |

*Between selective deposition/nonselective deposition: As is seen from Table 1, the number of treated sheets increases and the throughput is improved. From the measurements of scattering of layer thickness in the in-plane distribution and within-batch distribution, it can be also understood that the Al films are uniformly formed.

As is seen from Table 1, the number of treated sheets increases and the throughput is improved. From the measurements of scattering of layer thickness in the in-plane distribution and within-batch distribution, it can be also understood that the Al films are uniformly formed.

Experiment 2

As another example of the process for forming metal film according to the present invention, the process for forming Al film will be described with reference to FIG. 4.

After the wafer boats on which wafers were held were received in the reaction tube 301, the exhaust unit 313 and the pressure control valve 312 were operated to control the pressure inside the reaction tube to be at any desired level suited for the metal film formation.

The temperature inside the reaction tube was controlled by the heater 302.

Now, after the temperature and pressure reached predetermined levels, a starting material gas dimethylaluminum hydride (DMAH) and hydrogen gas were fed at an appropriate mixing ratio into the reaction tube from the gas inlet 306.

As a result, selective film growth of Al was effected on the conductive regions. Film formation at this stage was carried out under conditions set as follows: Temperatures, 270° to 290° C.; pressure inside the reaction tube, 1.2 Torr; and DMAH/H$_2$=1/10. Selective deposition carried out under such conditions resulted in a deposition rate of about 800 Å/min, and hence it took 7 minutes and 30 seconds to bury Al in 6,000 Å contact holes by the selective deposition.

After the contact holes had been buried, the high-frequency power source unit 311 was operated to generate plasma across the electrodes 303 and the opposing electrodes 305, to thereby carry out surface modification and deposition of Al also on SiO$_2$.

Since this surface modification becomes unnecessary once at least one atom layer of Al film has been formed on the surface, the irradiation with plasma was carried out for about 1 minute. For this reason, even though strutrurally an error or errors were more or less present in the distances between the electrodes 303 and the opposing electrodes 305, the deposition time of about 1 minute at most had no serious influence on the layer thickness distribution among wafers.

At the initiation of this non-selective deposition, the deposition at the time of the irradiation with plasma was carried out under the same conditions as the selective deposition with regard to the ratio of DMAH/H$_2$ and the temperature, and the irradiation with plasma was carried out under conditions of an RF power of 0.1 W/cm$^3$ as a maximum value and an electron density of about 10$^9$ cm$^{-3}$ as a minimum value. The surface modification on SiO$_2$ by this irradiation with plasma enabled formation of dense and uniform Al nuclei, and uniform Al films with less roughed surfaces and with a good quality were formed on SiO$_2$.

As described above, the dense and uniform Al nuclei were formed over the entire substrate surfaces on account of the surface modification, and hence, even though the irradiation with plasma was thereafter stopped, uniform Al films were formed on the entire surfaces.

The entire-surface Al deposition was at a deposition rate of about 800 Å/min.

The Al films deposited under such conditions had a resistivity of 3 μΩ·cm and thus it was possible to form good quality Al films good quality.

Experiment 3

On p-type silicon substrates, SiO$_2$ film of 2.0 μm thick were respectively formed, and contact holes with an aspect ratio of 2 to 3 were formed by etching.

Such wafers, prepared in plurality, were disposed in the apparatus as shown in FIG. 2.

WF$_6$ was fed into the reaction chamber at a flow rate of 0.5 SCCM, and also H$_2$ gas was fed thereinto at a flow rate of 500 SCCM.

The wafer temperature being maintained at 500° C., W films were selectively formed in the contact holes.

Next, a power source was switched on to generate plasma to make W films non-selectively grow on the W films having been selectively grown in the contact holes, end on the $SiO_2$ films.

As described above, according to the present invention, plasma is generated in the vicinity of plural sheets of wafers at one time and good metal films are uniformly formed. Hence, the throughput can be greatly improved and semiconductor devices can be fabricated at a low cost.

What is claimed is:

1. An apparatus for forming films on substrates comprising:

a reaction chamber;

a plurality of substrate-side and substrate-opposing electrodes alternately arranged in said reaction chamber, wherein each of said substrate-side electrodes has holders for holding at least one substrate, said substrate having a surface which is opposed to at least one of said substrate-opposing electrodes, wherein all the surfaces of the reaction chamber comprise an insulator material, except for the portions of the substrate-side and substrate-opposing electrodes which oppose the substrates;

an energy supply means that supplies to said substrate-side and substrate-opposing electrodes an electrical energy for generating plasma;

a heating means for heating a plurality of said substrates; and a gas feeding means that feeds into said reaction chamber a starting material gas for forming films;

said plasma being generated across said substrate-side and substrate-opposing electrodes to form films on said plurality of substrates.

2. The apparatus according to claim 1, wherein said reaction chamber is a quartz tube.

3. The apparatus according to claim 1, wherein said substrate-opposing electrodes are grounded.

4. The apparatus according to claim 1, wherein said heating means is a lamp.

5. The apparatus according to claim 1, wherein said gas feeding means comprises a bubbler.

6. The apparatus according to claim 1, wherein said reaction chamber is a quartz tube and said heater is provided outside said quartz tube.

7. An apparatus according to claim 1, which performs chemical vapor deposition to selectively form a film on a conductive surface.

8. An apparatus according to claim 1, which performs chemical vapor deposition such that a film is formed on a conductive surface in preference to film formation on an insulating surface.

9. An apparatus according to claim 1, wherein said gas feeding means feeds alkylaluminum hydride and hydrogen.

10. An apparatus for forming films on substrates comprising:

a reaction chamber;

a plurality of electrodes alternately arranged in said reaction chamber, wherein each of said electrodes has two surfaces, both of said surfaces having holders for holding at least one substrate, said substrate having a surface which is opposed to at least one of the surfaces of other said substrates, wherein all the surfaces of the reaction chamber comprise an insulator material, except for the portions of the surfaces of said plurality of electrodes covered with said substrates;

an energy supply means that supplies to said plurality of electrodes an electrical energy for generating plasma;

a heating means for heating a plurality of said substrates; and a gas feeding means that feeds into said reaction chamber a starting material gas for forming films;

said plasma being generated across said plurality of electrodes to form films on said plurality of substrates.

11. An apparatus according to claim 10, which performs chemical vapor deposition to selectively form a film on a conductive surface.

12. An apparatus according to claim 10, which performs chemical vapor deposition such that a film is formed on a conductive surface in preference to film formation on an insulating surface.

13. An apparatus according to claim 10, wherein said gas feeding means feeds alkylaluminum hydride and hydrogen.

* * * * *

UNITED STATES PATENT AND TRADEMARK OFFICE
CERTIFICATE OF CORRECTION

PATENT NO. : 5,653,810

DATED : August 5, 1997

INVENTOR(S): YUZO KATAOKA ET AL.

It is certified that error appears in the above-identified patent and that said Letters Patent is hereby corrected as shown below:

ON THE TITLE PAGE AT ITEM [54], IN THE TITLE
"AND PROCESS FOR FORMING METAL FILM" should be deleted.

ON TITLE PAGE AT ITEM [56] REFERENCES CITED, U.S. PATENT DOCUMENTS
Insert:
--5,145,711  9/92   Yamazaki et al. .......427/38
  5,041,201  8/91   Yamazaki et al. ......204/192.32
  5,074,456  12/91  Degner et al.........228/121
  5,273,586  12/93  Kim et al. ..........118/723E--

COLUMN 1
Line 2, lines 2 and 3 should be deleted;
Line 11, "film" should read --films--;
Line 13, "film," should read --films,--;
Line 14, "films" should read --film--;
Line 60, "Selectively" should read --selectively--.

COLUMN 5
Line 40, "close" should read --closed--.

COLUMN 8
Line 53, "12.6x10" should read --$12.6 \times 10^{-3}$--.

UNITED STATES PATENT AND TRADEMARK OFFICE
CERTIFICATE OF CORRECTION

PATENT NO. : 5,653,810

DATED : August 5, 1997

INVENTOR(S): YUZO KATAOKA ET AL.

It is certified that error appears in the above-identified patent and that said Letters Patent is hereby corrected as shown below:

COLUMN 9
 Table 1, "deposition: As is seen from Table" should read
   --deposition.--;
 Table 1, the last four lines of text under Table 1 should be deleted.

COLUMN 10
 Line 32, "strutrurally" should read --structurally--;
 Line 57, "films good quality." should read --films.--.

COLUMN 11
 Line 5, "end" should read --and--.

Signed and Sealed this

Seventh Day of April, 1998

Attest:

BRUCE LEHMAN

*Attesting Officer*  *Commissioner of Patents and Trademarks*